(12) United States Patent
Pulijala et al.

(10) Patent No.: US 9,467,096 B2
(45) Date of Patent: Oct. 11, 2016

(54) AMPLIFIER SYSTEM

(71) Applicant: TEXAS INSTRUMENTS INCORPORATED, Dallas, TX (US)

(72) Inventors: Srinivas K. Pulijala, Tucson, AZ (US); Steven G. Brantley, Satellite Beach, FL (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 18 days.

(21) Appl. No.: 14/642,317

(22) Filed: Mar. 9, 2015

(65) Prior Publication Data

US 2015/0263674 A1 Sep. 17, 2015

Related U.S. Application Data

(60) Provisional application No. 61/951,258, filed on Mar. 11, 2014.

(51) Int. Cl.
| | |
|---|---|
| *H03F 3/04* | (2006.01) |
| *H03F 1/02* | (2006.01) |
| *H03F 3/21* | (2006.01) |
| *H03F 3/45* | (2006.01) |
| *H03F 3/72* | (2006.01) |

(52) U.S. Cl.
CPC ............ *H03F 1/0266* (2013.01); *H03F 3/211* (2013.01); *H03F 3/4508* (2013.01); *H03F 3/72* (2013.01); *H03F 2200/261* (2013.01); *H03F 2200/27* (2013.01); *H03F 2200/411* (2013.01); *H03F 2200/432* (2013.01); *H03F 2203/45154* (2013.01); *H03F 2203/45248* (2013.01); *H03F 2203/45674* (2013.01); *H03F 2203/45676* (2013.01); *H03F 2203/45702* (2013.01)

(58) Field of Classification Search
CPC ........................................................ H03F 3/04
USPC ............................................. 330/252, 9, 51
See application file for complete search history.

(56) References Cited

U.S. PATENT DOCUMENTS

| | | | | |
|---|---|---|---|---|
| 4,006,428 A | * | 2/1977 | Meyer | ....................... H03F 1/52 330/207 P |
| 6,040,707 A | * | 3/2000 | Young | .............. H03K 19/00361 326/21 |
| 2009/0278597 A1 | * | 11/2009 | Zhang | ..................... H03F 3/005 330/9 |

* cited by examiner

*Primary Examiner* — Patricia T Nguyen
(74) *Attorney, Agent, or Firm* — Gregory J. Albin; Frank D. Cimino

(57) ABSTRACT

One example includes an amplifier system. The system includes a precision amplifier portion comprising a first input stage configured to receive an input voltage and a first output stage configured to generate an output voltage at the first output stage based on the input voltage. The system also includes a slew amplifier portion arranged in parallel with the precision amplifier portion and comprising a second input stage that receives the input voltage and a second output stage. The slew amplifier portion can be activated in response to a detected slew condition associated with the input voltage to generate the output voltage based on the input voltage.

20 Claims, 4 Drawing Sheets

AMPLIFIER SYSTEM

CROSS-REFERENCE TO RELATED APPLICATION

This application claims the benefit of U.S. Provisional Patent Application No. 61/951,258, filed Mar. 11, 2014, and entitled "DOUBLE FRONT END FOR HIGH SLEW RATE AND HIGH PRECISION FOR AN AMPLIFIER", which is incorporated herein by reference in its entirety.

TECHNICAL FIELD

This disclosure relates generally to electronic sensors, and more specifically to an amplifier system.

BACKGROUND

Amplifier systems can be implemented in a variety of circuit applications to increase or decrease an amplitude of a voltage. A typical amplifier system can receive an input voltage and adjust the amplitude of the input voltage to generate an output voltage that is an amplified version (e.g., increased or decreased amplitude) of the input voltage. Amplifier systems can be designed to react to slew conditions during which the input voltage can rapidly increase or decrease, such that the amplifier can provide substantially similar increases or decreases to the amplitude of the respective output voltage. However, high slew-rates in the input voltage can cause the amplifier system to exhibit a thermal tail, such as in a differential voltage amplifier system based on a mismatched temperature gradient in a set of input transistors, which could incur deleterious effects on precision. Furthermore, device saturation in the transistor devices of the amplifier system can occur in response to a high slew of the input voltage, which can result in additional performance problems associated with the amplifier system.

SUMMARY

One example includes an amplifier system. The system includes a precision amplifier portion comprising a first input stage configured to receive an input voltage and a first output stage configured to generate an output voltage at the first output stage based on the input voltage. The system also includes a slew amplifier portion arranged in parallel with the precision amplifier portion and comprising a second input stage that receives the input voltage and a second output stage. The slew amplifier portion can be activated in response to a detected slew condition associated with the input voltage to generate the output voltage based on the input voltage.

Another example includes a method for amplifying an input voltage via an amplifier system to generate an output voltage. The method includes receiving the input voltage at a first input stage associated with a precision amplifier portion of the amplifier system to generate the output voltage at a first output stage associated with the precision amplifier portion. The method also includes receiving the input voltage at a second input stage associated with a slew amplifier portion of the amplifier system and monitoring a slew-rate of the input voltage. The method further includes activating a current source associated with the slew amplifier portion in response to detecting a slew condition associated with the input voltage to substantially deactivate the precision amplifier portion and to generate the output voltage at a second output stage associated with the slew amplifier portion.

Another example includes an amplifier system. The system includes a slew detector configured to monitor a differential input voltage and to detect a slew condition in response to a rapid change in the differential input voltage. The system also includes a precision amplifier portion comprising a first input stage configured to receive the differential input voltage and a first output stage configured to generate a differential output voltage at the first output stage based on the differential input voltage. The system further includes a slew amplifier portion arranged in parallel with the precision amplifier portion and comprising a second input stage that receives the differential input voltage and a second output stage. The slew amplifier portion can be activated to divert a tail current generated via a power voltage from flowing through a first bias transistor of a pair of bias transistors in the first input stage to flow through a second bias transistor of a pair of bias transistors in the second input stage in response to the detected slew condition to generate the output voltage based on the differential input voltage and based on the diverted tail current.

DETAILED DESCRIPTION

Figure 1:
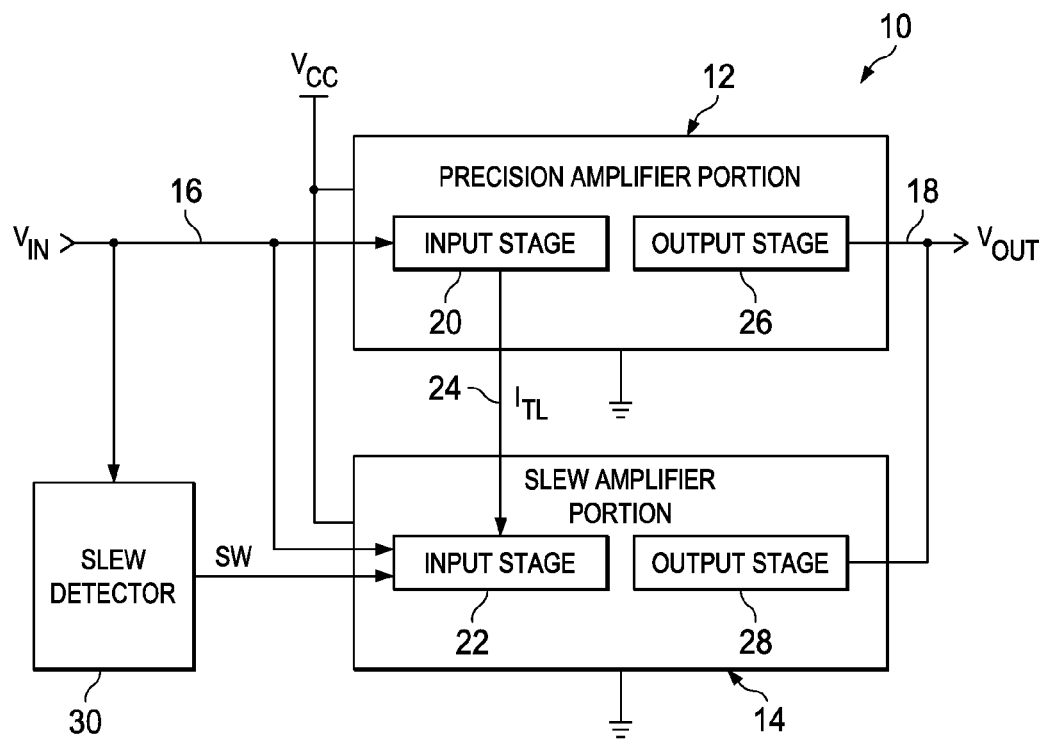
FIG. 1 illustrates an example of an amplifier system.

This disclosure relates generally to electronic sensors, and more specifically to an amplifier system. The amplifier system can include a precision amplifier portion and a slew amplifier portion that can be arranged in parallel with respect to an input node that receives an input voltage and an output node on which the output voltage is provided. As an example, the input voltage can be provided as a differential input voltage, and the output voltage can be provided from the amplifier system as a differential output voltage. Each of the precision amplifier portion and the slew amplifier portion include an input stage that receives the input voltage and an output stage that is coupled to the input stage and which provides the output voltage. The amplifier system also includes a slew detector that is configured to monitor an amplitude of the input voltage to detect a slew condition associated with a rapid change to the amplitude of the input voltage. In normal operating conditions, such that the amplifier system is generating the output voltage as an amplified version of a substantially stable input voltage, the slew amplifier portion can be substantially deactivated, such that the precision amplifier portion can be configured to generate the output voltage at the output node. In response to detecting the slew condition, the slew detector can be configured to substantially deactivate the precision amplifier portion by activating the slew amplifier portion, such that the slew amplifier portion generates the output voltage at the output node from the input voltage.

As an example, in response to detecting the slew condition, the slew detector is configured to deactivate a tail current source in the precision amplifier portion and to activate a current source that generates an activation current in the slew amplifier portion, wherein the activation current is greater than the substantially constant bias current in the precision amplifier portion. The precision amplifier portion and the slew amplifier portion can be electrically coupled via a node that interconnects a bias transistor associated with the input stages of each of the precision and slew amplifier portions, with the bias transistor interconnecting the node and an input transistor associated with the input stages of each of the precision and slew amplifier portions. Thus, in response to deactivation of the current source in the precision amplifier portion, the bias transistor in the input stage of the precision amplifier portion is substantially deactivated. However, in response to activation of the current source in the slew amplifier portion, the bias transistor in the input stage of the slew amplifier portion is substantially activated. Therefore, a tail current that flows from a power voltage to which both of the precision and slew amplifier portions are coupled is diverted from the precision amplifier stage to the slew amplifier stage. As a result, a thermal tail associated with the input transistor(s) of the input stage of the precision amplifier portion resulting from a high amplitude of the tail current based on a high slew-rate of the input voltage is mitigated, as the slew amplifier portion conducts the tail current during the slew condition. Accordingly, the amplifier system can be implemented to amplify the input voltage in precision applications based on substantially mitigating the deleterious effects of a thermal tail.

FIG. 1 illustrates an example of an amplifier system 10. The amplifier system 10 can be implemented in any of a variety of circuits to amplify an input voltage $V_{IN}$ to generate an output voltage $V_{OUT}$. For example, the amplifier system 10 can be implemented as an amplifier front-end, and can be implemented on an integrated circuit (IC) chip. Furthermore, as described in greater detail herein, the amplifier system 10 can be implemented as a differential amplifier, such that the input voltage $V_{IN}$ and the output voltage $V_{OUT}$ can each be differential output voltages.

The amplifier system 10 includes a precision amplifier portion 12 and a slew amplifier portion 14 that are arranged in parallel between an input node 16 on which the input voltage $V_{IN}$ is provided and an output node 18 on which the output voltage $V_{OUT}$ is generated. Each of the precision and slew amplifier portions 12 and 14 are powered by a power voltage $V_{CC}$ with respect to a low-voltage rail, demonstrated in the example of FIG. 1 as ground. Therefore, the precision and slew amplifier portions 12 and 14 are powered via the same power voltage $V_{CC}$ and arranged in parallel to cooperatively generate the output voltage $V_{OUT}$ based on the input voltage $V_{IN}$. As described in greater detail herein, the precision amplifier portion 12 is activated during a normal operating condition (e.g., in the absence of a high slew-rate of the input voltage $V_{IN}$) to generate the output voltage $V_{OUT}$ to a high degree of precision (e.g., sixteen bits), during which time the slew amplifier portion 14 is substantially deactivated. Conversely, the slew amplifier portion 14 is activated during a slew condition (e.g., a high slew-rate of the input voltage $V_{IN}$) to generate the output voltage $V_{OUT}$ in a manner that tracks the high slew-rate of the input voltage $V_{IN}$, and thus is rapidly reactive to the changes in the slew-rate of the input voltage $V_{IN}$, during which time the precision amplifier portion 12 is substantially deactivated.

As described herein, the term "substantially deactivated", with reference to the precision and/or slew amplifier portions 12 and/or 14, as well as the transistors therein, refers to a condition in which the transistors of the respective precision and/or slew amplifier portions 12 and/or 14 are either completely deactivated or minimally deactivated to provide a very small or nominal current flow. Thus, the substantial deactivation of one of the precision and/or slew amplifier portions 12 and/or 14 is such that the activation of the other of the precision and/or slew amplifier portions 12 and/or 14 dominates the performance of the substantially deactivated one of precision and/or slew amplifier portions 12 and/or 14 in generating the output voltage $V_{OUT}$.

In the example of FIG. 1, the precision amplifier portion 12 includes a first input stage 20 and the slew amplifier portion 14 includes a second input stage 22. The first and second input stages 20 and 22 are each configured to receive the input voltage $V_{IN}$. The first and second input stages 20 and 22 are electrically coupled via a node 24 through which a tail current IL flows, as described in greater detail herein. As an example, each of the first and second input stages 20 and 22 can include bias transistors that provide activation of the respective precision and slew amplifier portions 12 and 14, as well as input transistors that are controlled by the input voltage $V_{IN}$. Thus, the node 24 can couple the bias transistors associated with each of the first and second input stages 20 and 22. Additionally, the precision amplifier portion 12 includes a first output stage 26 and the slew amplifier portion 14 includes a second output stage 28. The first and second output stages 26 and 28 are each configured to generate the output voltage $V_{OUT}$ in response to respective activation of the precision amplifier portion 12 or the slew activation portion 14.

The amplifier system 10 further includes a slew detector 30 that is configured to monitor the amplitude of the input voltage $V_{IN}$. In response to a slew condition associated with a rapid change in the amplitude of the input voltage $V_{IN}$, the slew detector 30 can detect the slew condition to control respective activation of the precision and slew amplifier portions 12 and 14. As an example, the slew detector 30 can be configured to monitor a slew-rate of the input voltage $V_{IN}$, and can indicate detection of the slew condition in response to the slew-rate of the input voltage $V_{IN}$ exceeding a predetermined threshold. In response to detecting the slew condition, the slew detector 30 can provide a switch signal SW that is indicative of the slew condition to the slew amplifier portion 14. Thus, in response to the switch signal SW, the slew detector 30 can deactivate the precision amplifier portion 12 and activate the slew amplifier portion 14.

As an example, as described previously, the precision amplifier portion 12 can be in an activated state during a normal operating condition (e.g., in the absence of a high slew-rate of the input voltage $V_{IN}$) to generate the output voltage $V_{OUT}$ to a high degree of precision (e.g., sixteen bits). During this normal operating condition, the slew amplifier portion 14 can be substantially deactivated. However, in response to detecting the slew condition, the slew detector 30 can provide the switch signal SW to the slew amplifier portion 14 to change the state of the precision amplifier portion 12 from activated to substantially deactivated and to change the state of the slew amplifier portion 14 from substantially deactivated to activated. As an example, the precision and slew amplifier portions 12 and 14 can each include respective power supplies that control respective activation states based on activation currents, with the activation current of the slew amplifier portion 14 being greater than a substantially constant bias current associated with the precision amplifier portion 12. Therefore, in response to the switch signal SW, and thus the detected slew condition, the slew amplifier portion 14 can be configured to generate the output voltage $V_{OUT}$.

Upon activation, the slew amplifier portion 14 can be configured to divert a large portion of the tail current $I_{TL}$ from the first input stage 20 to the second input stage 22. For example, the tail current $I_{TL}$ can be configured to flow from the power voltage $V_{CC}$ through an input transistor that is controlled by the input voltage $V_{IN}$ in the first input stage 20 during the normal operating condition based on an activation current provided by a current source in the precision amplifier portion 12. However, upon activation of the slew amplifier portion 14 during the slew condition, the tail current $I_{TL}$ can greatly increase in amplitude to enable the slew amplifier portion 14 to be able to react to the rapid slew-rate of the input voltage $V_{IN}$ in generating the output voltage $V_{OUT}$. Thus, the slew amplifier portion 14 can be configured to divert a large majority of the tail current $I_{TL}$ from flowing through the input transistor in the first input stage 20 to instead flow through an input transistor that is likewise controlled by the input voltage $V_{IN}$ in the second input stage 22. Therefore, the greatly increased amplitude of the tail current $I_{TL}$ can flow through the slew amplifier portion 14 instead of the precision amplifier portion 12. As a result, deleterious effects associated with a thermal tail, such as a thermal mismatch between input transistors in a differential pair, can be mitigated in the precision amplifier portion 12, thus allowing the precision amplifier portion 12 to generate the output voltage $V_{OUT}$ in a manner that substantially mitigates settling errors associated with a thermal tail during the normal operating state of the amplifier system 10.

Figure 2:
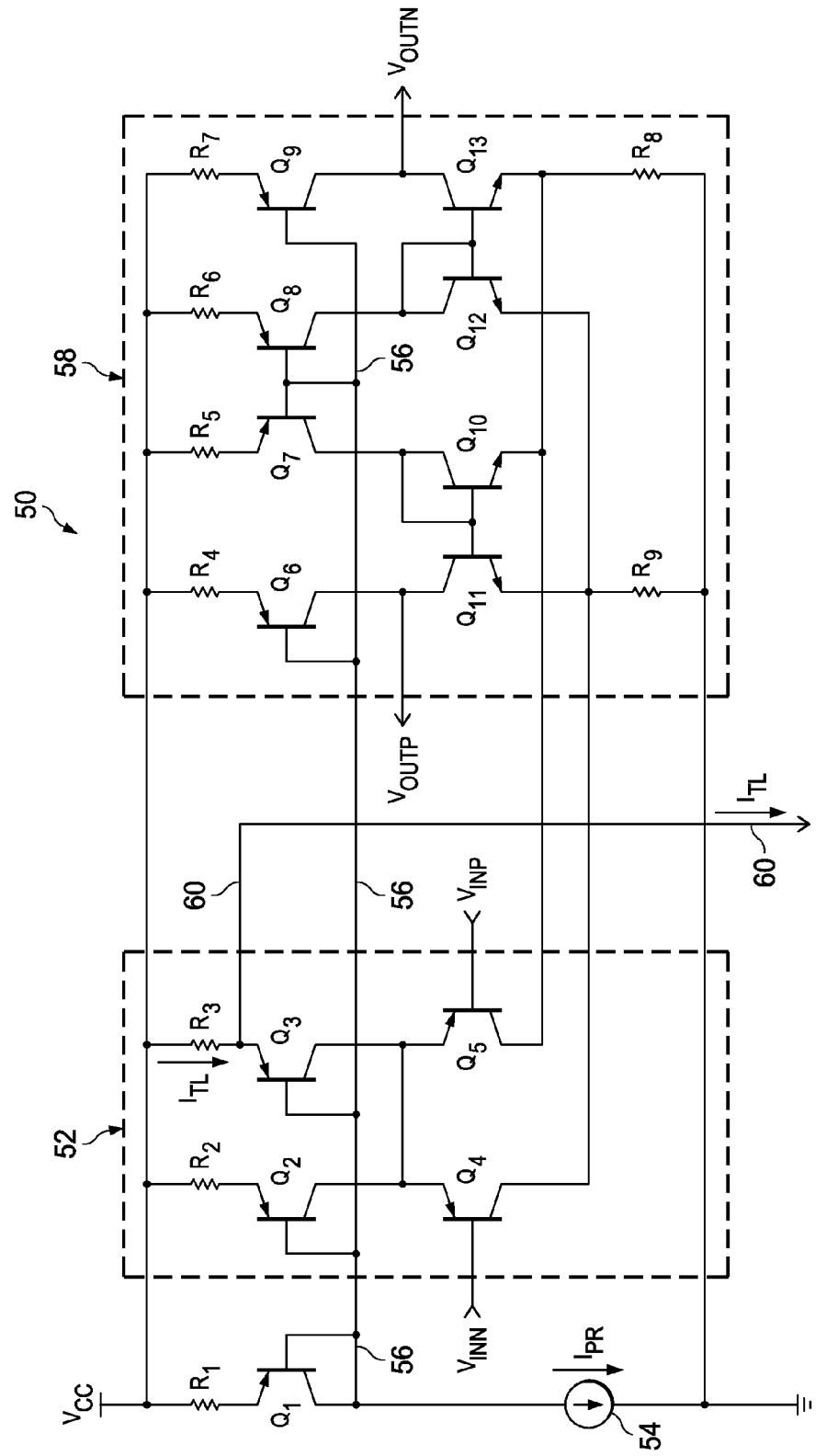
FIG. 2 illustrates an example of a precision amplifier portion of an amplifier system.

FIG. 2 illustrates an example of a precision amplifier portion 50 of an amplifier system (e.g., the amplifier system 10). The precision amplifier portion 50 is configured to generate an output voltage $V_{OUT}$ based on an input voltage $V_{IN}$ during a normal operating condition. The precision amplifier portion 50 can correspond to the precision amplifier portion 12 in the example of FIG. 1. Therefore, reference is to be made to the example of FIG. 1 in the following description of the example of FIG. 2.

The precision amplifier portion 50 includes an input stage 52 that is configured to receive a differential input voltage, demonstrated as voltages $V_{INN}$ and $V_{INP}$. As described herein, the term "input voltage $V_{IN}$" can be used to refer to both of the differential input voltages $V_{INN}$ and $V_{INP}$. The precision amplifier portion 50 is powered by a power voltage $V_{CC}$, and includes a current source 54 that is configured to generate a substantially constant DC bias current $I_{PR}$. During a normal operating condition, the precision amplifier portion 50 is biased via the substantially constant bias current $I_{PR}$ that flows from the power voltage $V_{CC}$ through a resistor $R_1$ and through a diode-connected transistor $Q_1$, demonstrated in the example of FIG. 2 as a PNP-type bipolar junction transistor (BJT). The transistor $Q_1$ has a base that is coupled to a node 56 that is likewise coupled to bases of a pair of PNP-type bias transistors $Q_2$ and $Q_3$ in current-mirror arrangements in the input stage 52. The bias transistors $Q_2$ and $Q_3$ are likewise coupled to the power voltage via respective resistors $R_2$ and $R_3$. The collectors of the transistors $Q_2$ and $Q_3$ are coupled to a first input transistor $Q_4$ that is controlled by the input voltage $V_{INN}$ and to a second input transistor $Q_5$ that is controlled by the input voltage $V_{INP}$.

The precision amplifier portion 50 also includes an output stage 58 that is configured to generate a differential output voltage, demonstrated as voltages $V_{OUTN}$ and $V_{OUTP}$. As described herein, the term "output voltage $V_{OUT}$" can be used to refer to both of the differential output voltages $V_{OUTN}$ and $V_{OUTP}$. The output stage 58 includes PNP-type bias transistors $Q_6$, $Q_7$, $Q_8$, and $Q_9$ that all have bases coupled to the node 56 in current-mirror arrangements, and which are coupled to the power voltage $V_{CC}$ via respective resistors $R_4$, $R_5$, $R_6$, and $R_7$. The bias transistor $Q_7$ has a collector that is coupled to a collector of an NPN-type transistor $Q_{10}$ and the bias transistor $Q_6$ has a collector that is coupled to a collector of an NPN-type output transistor $Q_{11}$. Similarly, the bias transistor $Q_8$ has a collector that is coupled to a collector of an NPN-type transistor $Q_{12}$ and the bias transistor $Q_9$ has a collector that is coupled to a collector of an NPN-type output transistor $Q_{13}$. In the example of FIG. 2, the transistor $Q_{10}$ is diode-connected with a base that is coupled to the base of the output transistor $Q_{11}$, and the transistor $Q_{12}$ is diode-connected with a base that is coupled to the base of the output transistor $Q_{13}$. As an example, the output transistors $Q_{11}$ and $Q_{13}$ can each have a size that is greater than a size of the respective transistors $Q_{10}$ and $Q_{12}$ to provide greater collector-emitter current conduction relative to the transistors $Q_{10}$ and $Q_{12}$.

The emitters of the transistor $Q_{10}$ and the output transistor $Q_{13}$ are coupled to the collector of the input transistor $Q_5$ and are coupled to a low-voltage rail (e.g., ground in the example of FIG. 2) via a resistor $R_8$. Similarly, the emitters of the transistor $Q_{12}$ and the output transistor $Q_{11}$ are coupled to the collector of the input transistor $Q_4$ and are coupled to the low-voltage rail via a resistor $R_9$. Thus, the resistors $R_8$ and $R_9$ act as a level-shifter circuit to provide a boosted amplitude of the output voltage $V_{OUT}$, such that the level-shift of the resistors $R_8$ and $R_9$ provides a gain for the output voltage $V_{OUT}$ that is a non-linear (e.g., square) function of a bias current flowing through the resistors $R_8$ and $R_9$. Therefore, in response to the differential input voltages $V_{INN}$ and $V_{INP}$, based on the arrangement of the transistor $Q_1$ relative to the bias transistors $Q_6$, $Q_7$, $Q_8$, and $Q_9$, the output transistors $Q_{11}$ and $Q_{13}$ are configured to generate the differential output voltages $V_{OUTP}$ and $V_{OUTN}$, respectively.

During the normal operating condition, and thus when the current source 54 is providing the bias current $I_{PR}$, a tail current $I_{TL}$ flows through the resistor $R_3$, through the bias transistor $Q_3$, and through the input transistors $Q_4$ and $Q_5$. During a slew condition, such as based on which the voltage $V_{INP}$ increases rapidly, then the large amplitude tail current $I_{TL}$ would flow through the input transistor $Q_4$ to provide an uneven temperature between the input transistors $Q_4$ and $Q_5$. The uneven distribution of temperature between the input transistors $Q_4$ and $Q_5$ results in a thermal tail having a long settling time, such that the input transistors $Q_4$ and $Q_5$ exhibit unequal operational characteristics that can result in a performance degradation of the associated amplifier system 10 during the long settling time. For example, the precision amplifier portion 50 may not be able to generate the output voltage $V_{IN}$ at a required precision (e.g., sixteen bits) during existence of the thermal tail.

Accordingly, to substantially mitigate the thermal tail in the precision amplifier portion 50, the slew detector 30 substantially deactivates the precision amplifier portion 50 via steering of the tail current $I_{TL}$ from the node 60 to the slew amplifier portion 14. The deactivation of the precision amplifier portion 50 can be accompanied by activation of a parallel-connected slew amplifier portion (e.g., the slew amplifier portion 14) via an activation current having a greater amplitude than the bias current $I_{PR}$. In the example of FIG. 2, the resistor $R_3$ and the emitter of the bias transistor $Q_3$ are electrically coupled via a node 60. The node 60 is also coupled to an input stage of a slew amplifier portion (e.g., the second input stage 22 of the slew amplifier portion 14 in the example of FIG. 1). Therefore, in response to the substantial deactivation of the precision amplifier portion 50 and the activation of the associated slew amplifier portion (e.g., the slew amplifier portion 14 in the example of FIG. 1), the higher amplitude tail current $I_{TL}$ is diverted from flowing through the bias transistor $Q_3$ and the input transistor $Q_5$, and instead flows to the associated slew amplifier portion via the node 60.

It is to be understood that the bias transistors $Q_1$, $Q_2$, $Q_3$, $Q_6$, $Q_7$, $Q_8$, and $Q_9$ may still be in a forward-active region of operation to conduct nominal amounts of current during the slew condition, thus providing nominal activation of the input transistors $Q_4$ and $Q_5$ as well as the output transistors $Q_{11}$ and $Q_{13}$ via the transistors $Q_{10}$ and $Q_{12}$ during the slew condition. However, the contribution of the output transistors $Q_{11}$ and $Q_{13}$ to the generation of the output voltage $V_{OUT}$ can be minimal during the slew condition, such that output transistors in the second output stage 28 of the slew amplifier portion 14 can dominate the generation of the output voltage $V_{OUT}$ during the slew operating condition. In addition, it is to be understood that, based on the maintained forward-active region of operation of the bias transistors $Q_1$, $Q_2$, $Q_3$, $Q_6$, $Q_7$, $Q_8$, and $Q_9$, a very small amount of current from the transistor $Q_2$ can still flow through the input transistors $Q_4$ and $Q_5$. However, the very small amount of the current from the transistor $Q_2$ can be insufficient to cause a detrimental thermal tail associated with the precision amplifier portion 50.

Figure 3:
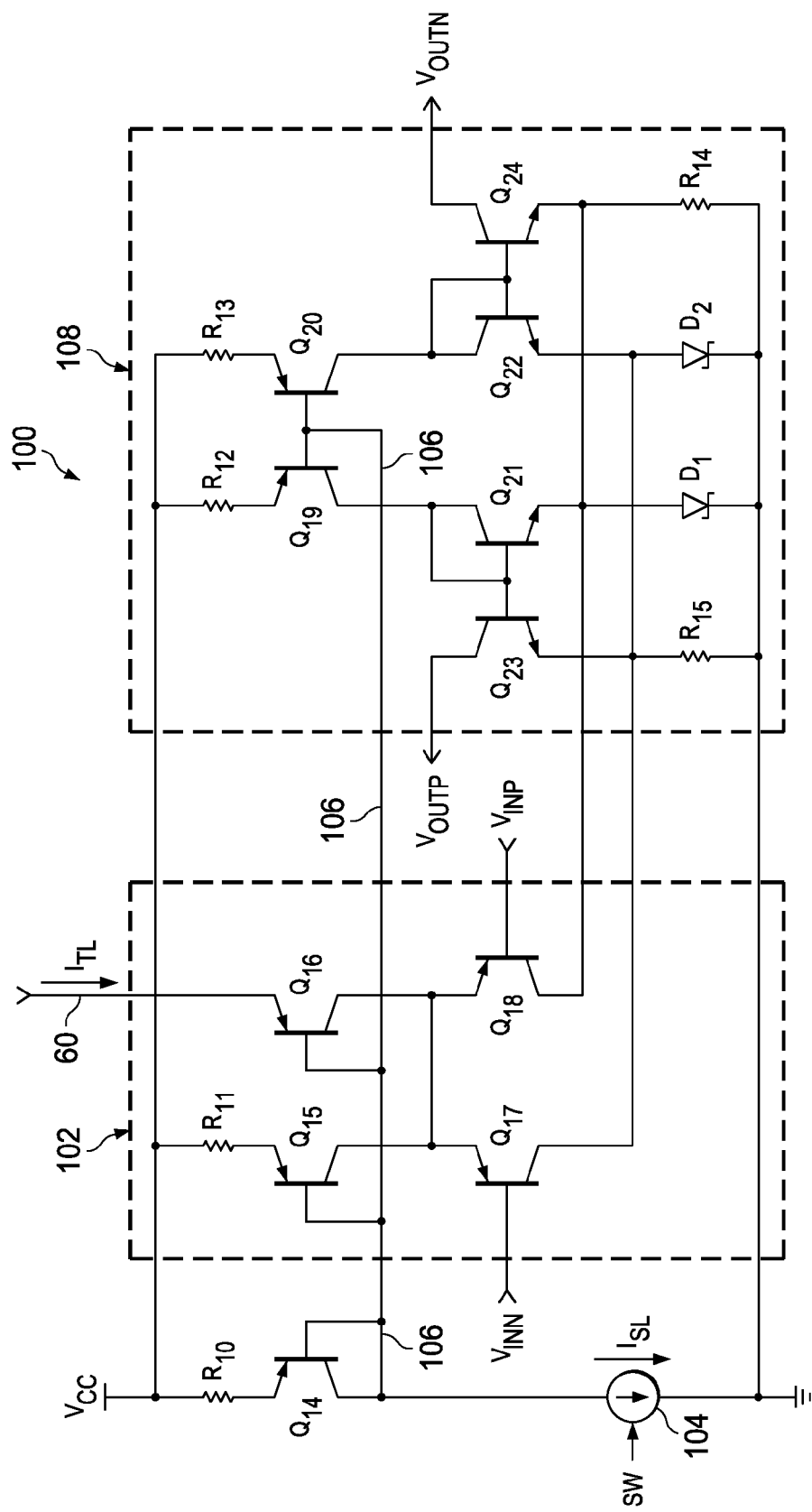
FIG. 3 illustrates an example of a slew amplifier portion of an amplifier system.

FIG. 3 illustrates an example of a slew amplifier portion 100 of an amplifier system (e.g., the amplifier system 10). The slew amplifier portion 100 is configured to generate the output voltage $V_{OUT}$ based on the input voltage $V_{IN}$ during a slew operating condition. The slew amplifier portion 100 can correspond to the slew amplifier portion 14 in the example of FIG. 1. Additionally, the slew amplifier portion 100 can be coupled in parallel with the precision amplifier portion 50 in the example of FIG. 2 between the input node 16 and the output node 18. Therefore, reference is to be made to the example of FIGS. 1 and 2 in the following description of the example of FIG. 3.

The slew amplifier portion 100 includes an input stage 102 that is configured to receive the differential input voltages $V_{INN}$ and $V_{INP}$. The slew amplifier portion 100 is powered by a power voltage $V_{CC}$ relative to the low-voltage rail (e.g., ground), and includes a current source 104 that is configured to generate an activation current $I_{SL}$ in response to a switch signal SW, such as generated by the slew detector 30. When the slew amplifier portion 100 is activated via the switch signal SW during a normal operating condition, the current source 104 provides the activation current $I_{SL}$ that flows from the power voltage $V_{CC}$ through a resistor $R_{10}$ and through a diode-connected PNP-type transistor $Q_{14}$. The transistor $Q_{14}$ has a base that is coupled to a node 106 that is likewise coupled to bases of a pair of PNP-type bias transistors $Q_{15}$ and $Q_{16}$ in current-mirror arrangements in the input stage 102. The bias transistor $Q_{15}$ is likewise coupled to the power voltage via a resistor $R_{11}$, and the bias transistor $Q_{16}$ has an emitter that is coupled to the node 60.

Additionally, the collectors of the bias transistors $Q_{15}$ and $Q_{16}$ are coupled to a first input transistor $Q_{17}$ that is controlled by the input voltage $V_{INN}$ and to a second input transistor $Q_{18}$ that is controlled by the input voltage $V_{INP}$. During the slew condition, based on the activation current $I_{SL}$ and the arrangement of the transistor $Q_{14}$ relative to the bias transistor $Q_{16}$, the input voltage $V_{INP}$ can control the input transistor $Q_{18}$ to conduct the tail current $I_{TL}$ from the power voltage $V_{CC}$ through the resistor $R_3$ in the input stage 52 of the precision amplifier stage 50 through the bias transistor $Q_{16}$ via the node 60 and through the input transistor $Q_{18}$. Accordingly, during the slew condition, the slew amplifier portion 100 diverts the tail current $I_{TL}$ from the precision amplifier portion 50 to the slew amplifier portion 100, as described herein.

The slew amplifier portion 100 also includes an output stage 108 that is configured to generate the differential output voltages $V_{OUTN}$ and $V_{OUTP}$. The output stage 108 includes PNP-type bias transistors $Q_{19}$ and $Q_{20}$ that have bases coupled to the node 106 in current-mirror arrangements, and which are coupled to the power voltage $V_{CC}$ via respective resistors $R_{12}$ and $R_{13}$. The bias transistor $Q_{19}$ has a collector that is coupled to a collector of an NPN-type transistor $Q_{21}$ and the bias transistor $Q_{20}$ has a collector that is coupled to a collector of an NPN-type transistor $Q_{22}$. In the example of FIG. 3, the transistor $Q_{21}$ is diode-connected with a base that is coupled to the base of an NPN-type output transistor $Q_{23}$, and the transistor $Q_{22}$ is diode-connected with a base that is coupled to the base of an NPN-type output transistor $Q_{24}$. As an example, the output transistors $Q_{23}$ and $Q_{24}$ can each have a size that is greater than a size of the respective transistors $Q_{21}$ and $Q_{22}$ to provide greater collector-emitter current conduction relative to the transistors $Q_{21}$ and $Q_{22}$. The emitters of the transistor $Q_{21}$ and the output transistor $Q_{24}$ are coupled to the collector of the input transistor $Q_{18}$ and are coupled to the low-voltage rail via a resistor $R_{14}$. Similarly, the emitters of the transistor $Q_{22}$ and the output transistor $Q_{23}$ are coupled to the collector of the input transistor $Q_{17}$ and are coupled to the low-voltage rail via a resistor $R_{15}$. Thus, the resistors $R_{14}$ and $R_{15}$ act as a level-shifter circuit to provide a boosted amplitude of the output voltage $V_{OUT}$, such that the level-shift of the resistors $R_{14}$ and $R_{15}$ provides a gain for the output voltage $V_{OUT}$ that is a non-linear (e.g., square) function of a bias current flowing through the resistors $R_{14}$ and $R_{15}$. Therefore, in response to the activation current $I_{SL}$ and the differential input voltages $V_{INN}$ and $V_{INP}$, based on the arrangement of the transistor $Q_{14}$ relative to the bias transistors $Q_{19}$ and $Q_{20}$, the output transistors $Q_{23}$ and $Q_{24}$ are configured to generate the differential output voltages $V_{OUTP}$ and $V_{OUTN}$, respectively.

As described previously, during the slew operating condition, and thus when the current source 104 is providing the activation current $I_{SL}$, the tail current $I_{TL}$ flows from the power voltage $V_{CC}$ through the resistor $R_3$ in the input stage 52 of the precision amplifier stage 50 through the bias transistor $Q_{16}$ via the node 60 and through the input transistors $Q_{17}$ and $Q_{18}$. Therefore, during the slew condition, the large amplitude tail current $I_{TL}$ flows through the input transistors $Q_{17}$ and $Q_{18}$ based on the voltages $V_{INP}$ and $V_{INN}$. As a result, an uneven temperature gradient is provided between the input transistors $Q_{17}$ and $Q_{18}$, which causes a thermal tail in the input stage 102 of the slew amplifier portion 100. However, because the slew amplifier portion 100 diverts the tail current $I_{TL}$ from the precision amplifier portion 50 to the slew amplifier portion 100, and thus substantially mitigates the large amplitude tail current $I_{TL}$ from flowing through the input transistors $Q_4$ and $Q_5$ in the input stage 52 of the precision amplifier portion 50, the precision amplifier portion 50 is not subject to a long settling time thermal tail.

Accordingly, the precision amplifier portion 50 can generate the output voltage $V_{OUT}$ at high precision during the normal operating condition, such as while the thermal tail settles in the slew amplifier portion 100, and is thus not subject to the deleterious effects of the thermal tail. For example, the gain of the slew amplifier portion 100 can be approximately proportional to a square of the bias current through the resistors $R_{14}$ and $R_{15}$, such that after the slew condition (and upon returning to the normal operating condition), thermally induced offsets can be attenuated by a large factor when referred back to the input node 16 of the amplifier system 10. As an example, during the normal operating condition, the slew amplifier portion 100 can be biased at approximately 10% of the precision amplifier portion 50, with a gain that is approximately 1% of the precision amplifier portion 50, so that any thermally induced offsets resulting from the slew condition (and/or a DC overload) can be attenuated by approximately one-hundred times when referred back to the input node 16 of the amplifier system 10. In addition, based on the implementation of both the precision amplifier portion 50 and the slew amplifier portion 100, the amplifier system 10 can implement smaller transistor devices relative to other types of amplifier and front-end amplifier systems that implement large transistors to attempt to mitigate thermal tail effects. By using smaller transistor devices, the amplifier system 10 can have a more compact design for a smaller layout area, and can exhibit improved AC performance with an improved overload and thermal settling time relative to typical amplifier systems.

Similar to as described previously with regard to the precision amplifier portion 50, despite deactivation of the current source 104 during the normal operating condition, it is to be understood that the bias transistors $Q_{14}$, $Q_{15}$, $Q_{16}$, $Q_{19}$, and $Q_{20}$ may still be in a forward-active region of operation to conduct nominal amounts of current, thus providing nominal activation of the input transistors $Q_{17}$ and $Q_{18}$ as well as the output transistors $Q_{23}$ and $Q_{24}$ via the transistors $Q_{21}$ and $Q_{22}$. However, the contribution of the output transistors $Q_{23}$ and $Q_{24}$ to the generation of the output voltage $V_{OUT}$ can be minimal during the normal operating condition, such that the output transistors $Q_{11}$ and $Q_{13}$ in the output stage 58 of the precision amplifier portion 50 can dominate the generation of the output voltage $V_{OUT}$ during the normal operating condition.

Figure 4:
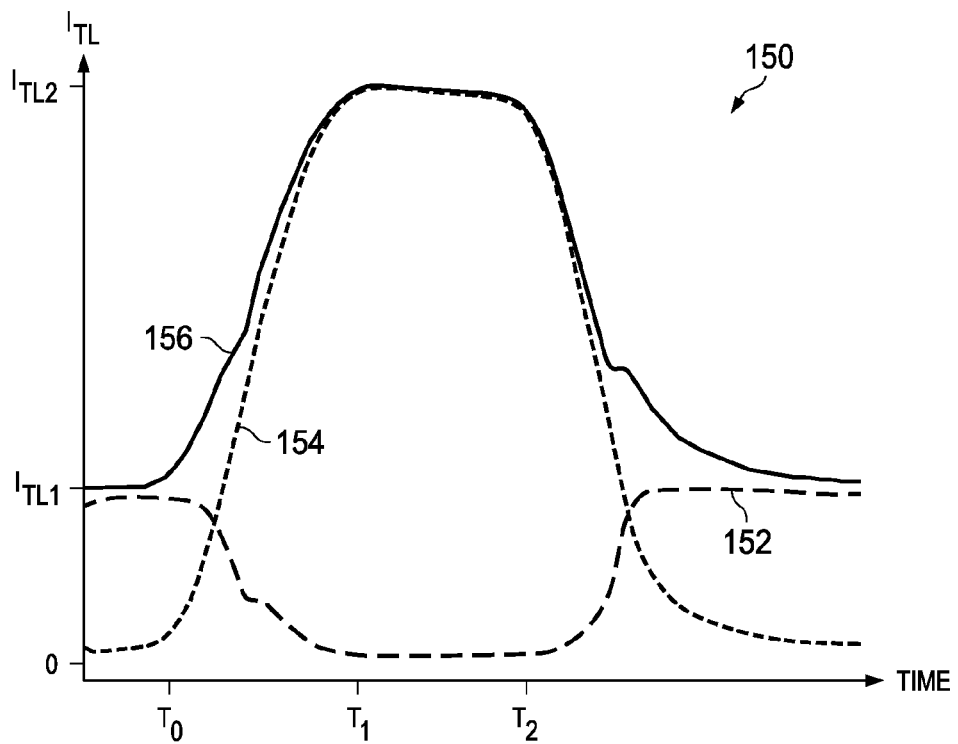
FIG. 4 illustrates an example of a graph of tail current.

FIG. 4 illustrates an example of a graph 150 of tail current $I_{TL}$. The graph 150 demonstrates the tail current $I_{TL}$ as a function of time. The tail current $I_{TL}$ on the vertical axis corresponds to an amplitude of tail current $I_{TL}$ in the amplifier system 10, and thus with respect to the precision amplifier portion 50 and the slew amplifier portion 100. Therefore, reference is to be made to the examples of FIGS. 1-3 in the following description of the example of FIG. 4.

In the example of FIG. 4, the graph 150 demonstrates three curves. A first curve 152 (hereinafter "precision tail current 152") is indicated by a dashed line and corresponds to an amplitude of the portion of the tail current $I_{TL}$ that flows through the input transistor $Q_5$ in the input stage 52 of the precision amplifier portion 50. A second curve 154 (hereinafter "slew tail current 154") is indicated by a dotted line and corresponds to an amplitude of the portion of the tail current $I_{TL}$ that flows through the input transistor $Q_{18}$ in the input stage 102 of the slew amplifier portion 100. A third curve 156 (hereinafter "total tail current 156") is indicated by a solid line and corresponds to a total amplitude of the tail current $I_{TL}$ that flows through the resistor $R_3$ in the input stage 52 of the precision amplifier portion 50, and is thus a sum of the portions of the tail current indicated by the first and second curves 152 and 154.

At a time prior to a time $T_0$, the amplifier system 10 can be operating in the normal operating condition. Therefore, the precision amplifier portion 50 is activated, such that the current source 54 is providing the bias current $I_{PR}$ and the output transistors $Q_{11}$ and $Q_{13}$ are providing (e.g., dominating generation of) the output voltage $V_{OUT}$ at the output node 18 in response to the input voltage $V_{IN}$ received at the input node 16. Also at the time prior to the time $T_0$, the slew amplifier portion 100 can be substantially deactivated, such that the current source 104 is deactivated and is not providing the activation current $I_{SL}$. Therefore, at the time prior to the time $T_0$, the total tail current 156 has an amplitude $I_{TL1}$ that is a sum of the precision tail current 152 having an amplitude that is just less than the amplitude $I_{TL1}$ and the slew tail current 154 having an amplitude that is just greater than zero (e.g., based on nominal activation of the transistors in the slew amplifier portion 100).

At the time $T_0$, the slew detector 30 can detect the slew condition, such as based on an increase in the input voltage $V_{IN}$ greater than a slew-rate threshold. In response, the slew detector 30 can provide the switch signal SW to the slew amplifier portion 100 to substantially deactivate the precision amplifier portion 50 and to activate the slew amplifier portion 100. Therefore, the slew amplifier portion 100 is activated, such that the current source 104 is providing the activation current $I_{SL}$ and the output transistors $Q_{23}$ and $Q_{24}$ are providing (e.g., dominating generation of) the output voltage $V_{OUT}$ at the output node 18 in response to the input voltage $V_{IN}$ received at the input node 16. At the time $T_0$, the precision amplifier portion 50 is substantially deactivated, such that the tail current $I_{TL}$ is steered away from flowing through the transistor $Q_3$. Therefore, subsequent to the time $T_0$, the precision tail current 152 begins to decrease and the slew tail current 154 begins to increase significantly. The total tail current 156 thus likewise increases significantly to achieve a maximum amplitude $I_{TL2}$ at a time $T_1$, at which time the precision tail current 152 has an amplitude that is just greater than zero (e.g., based on nominal activation of the transistors in the precision amplifier portion 50) and the slew tail current 154 has an amplitude that is just less than the amplitude $I_{TL2}$, and thus just less than the total tail current 156.

At a time $T_2$, the slew detector 30 can detect an end of the slew condition, such as based on an amplitude of the input voltage $V_{IN}$ being less than the slew-rate threshold. In response, the slew detector 30 can again provide the switch signal SW (e.g., in an opposite state than in the slew condition) to the slew amplifier portion 100 to substantially deactivate the slew amplifier portion 100 and to reactivate the precision amplifier portion 50. Therefore, the precision amplifier portion 50 is once again activated, such that the tail current $I_{TL}$ is again provided through the transistor $Q_3$ and the output transistors $Q_{11}$ and $Q_{13}$ are providing (e.g., dominating generation of) the output voltage $V_{OUT}$ at the output node 18 in response to the input voltage $V_{IN}$ received at the input node 16. At the time $T_2$, the slew amplifier portion 100 is substantially deactivated, such that the current source 104 is deactivated and is not providing the activation current $I_{SL}$. Therefore, subsequent to the time $T_2$, the precision tail current 152 begins to increase and the slew tail current 154 begins to decrease significantly. The total tail current 156 thus likewise decreases significantly to approximately return to the amplitude $I_{TL1}$ at a time $T_1$, at which time the precision tail current 152 has an amplitude that is just less than the amplitude $I_{TL1}$ and the slew tail current 154 has an amplitude that is just greater than zero (e.g., based on nominal activation of the transistors in the slew amplifier portion 100).

Accordingly, during the slew condition between the times $T_0$ and $T_2$, the large amplitude of the tail current $I_{TL}$, indicated by the slew tail current 154 in the example of FIG.

4, is diverted from flowing through the transistor $Q_3$ of the input stage 52 of the precision amplifier portion 50, and instead flows through the transistor $Q_{16}$ of the input stage 102 of the slew amplifier portion 100. As a result, the detrimental results of a thermal tail is substantially mitigated in the precision amplifier portion 50, thus allowing precise generation of the output voltage $V_{OUT}$ based on amplification of the input voltage $V_{IN}$ during the normal operating condition.

In addition, referring back to the example of FIG. 3, the emitters of the transistor $Q_{21}$ and the output transistor $Q_{24}$ are coupled to the low-voltage rail via a voltage clamp $D_1$ in parallel with the resistor $R_{14}$, and the emitters of the transistor $Q_{22}$ and the output transistor $Q_{23}$ are coupled to the low-voltage rail via a voltage clamp $D_2$ in parallel with the resistor $R_{15}$. In the example of FIG. 3, the voltage clamps $D_1$ and $D_2$ are configured as Schottky diodes. The voltage clamps $D_1$ and $D_2$ are configured to provide a parallel current path for the bias current that provides the gain for the output stage 108 to substantially mitigate saturation of the input transistors $Q_{17}$ and $Q_{18}$ in response to the rapid increase in the voltage amplitude of the input voltage $V_{IN}$, and thus the large amplitude tail current $I_{TL}$. In addition, because the voltage clamps $D_1$ and $D_2$ are only necessary to prevent saturation of the input transistors $Q_{17}$ and $Q_{18}$ in response to the slew condition, the voltage clamps $D_1$ and $D_2$ can be included only in the slew amplifier portion 100, and can be omitted from the precision amplifier portion 50. As a result, offset voltages or thermal drift that can be exhibited based on the voltage clamps $D_1$ and $D_2$, such as having negative effects on precision, are not exhibited in the output voltage $V_{OUT}$ in the normal operating condition based on the omission of the voltage clamps $D_1$ and $D_2$ in the precision amplifier portion 50.

Figure 5:
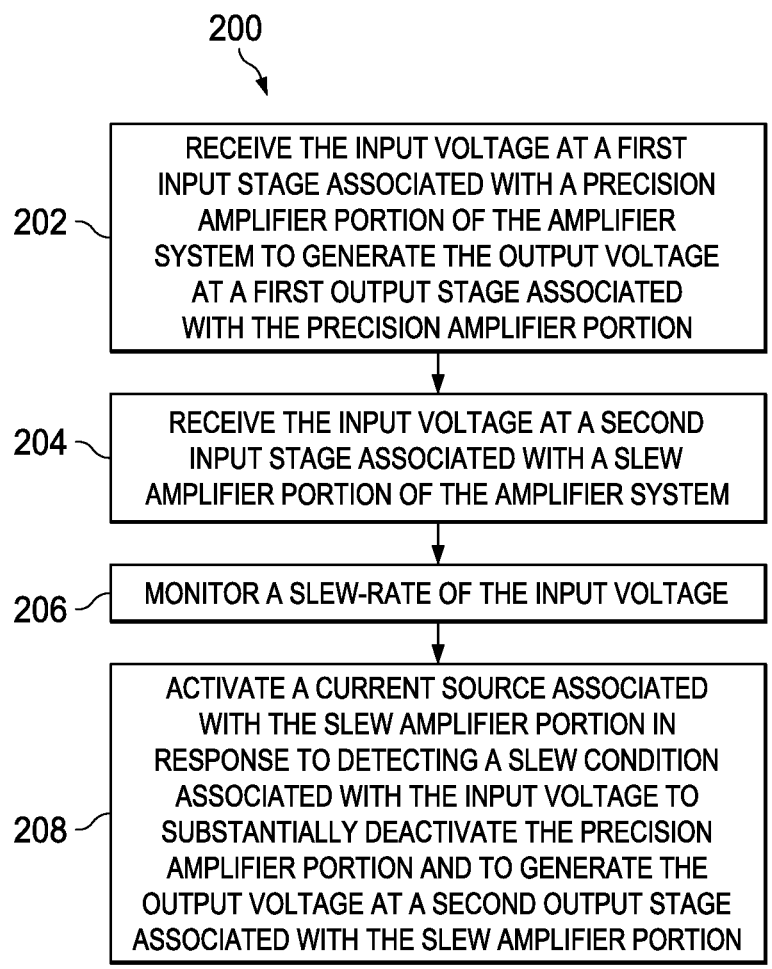
FIG. 5 illustrates an example of a method for amplifying an input voltage via an amplifier system to generate an output voltage.

In view of the foregoing structural and functional features described above, a method in accordance with various aspects of the present invention will be better appreciated with reference to FIG. 5. While, for purposes of simplicity of explanation, the method of FIG. 5 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a method in accordance with an aspect of the present invention.

FIG. 5 illustrates an example of a method 200 for amplifying an input voltage (e.g., the input voltage $V_{IN}$) via an amplifier system (e.g., the amplifier system 10) to generate an output voltage (e.g., the output voltage $V_{OUT}$). At 202, the input voltage is received at a first input stage (e.g., the first input stage 20) associated with a precision amplifier portion (e.g., the precision amplifier portion 12) of the amplifier system to generate the output voltage at a first output stage (e.g., the first output stage 26) associated with the precision amplifier portion. At 204, the input voltage is received at a second input stage (e.g., the second input stage 22) associated with a slew amplifier portion (e.g., the slew amplifier portion 14) of the amplifier system. At 206, a slew-rate of the input voltage is monitored (e.g., via the slew detector 30). At 208, activating a current source (e.g., the current source 104) associated with the slew amplifier portion in response to detecting a slew condition associated with the input voltage to substantially deactivate the precision amplifier portion and to generate the output voltage at a second output stage (e.g., the second output stage 28) associated with the slew amplifier portion.

What have been described above are examples of the invention. It is, of course, not possible to describe every conceivable combination of components or method for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. An amplifier system comprising:
   a precision amplifier portion comprising a first input stage configured to receive an input voltage and a first output stage configured to generate an output voltage at the first output stage based on the input voltage; and
   a slew amplifier portion arranged in parallel with the precision amplifier portion and comprising a second input stage that receives the input voltage and a second output stage, the slew amplifier portion being activated in response to a detected slew condition associated with the input voltage to generate the output voltage based on the input voltage.

2. The system of claim 1, wherein each of the first and second input stages receives a power voltage, wherein the slew amplifier portion is configured to divert a tail current generated via the power voltage from the first input stage to the second input stage in response to the detected slew condition to generate the output voltage based on the input voltage and based on the diverted tail current.

3. The system of claim 2, wherein the first input stage and the second input stage are coupled via a node that couples a first bias transistor associated with the first input stage and a second bias transistor associated with the second input stage, wherein the tail current is configured to flow from the power voltage through a resistor into the node, and wherein, during the slew condition, substantially all of the tail current is configured to flow from the node through the second bias transistor.

4. The system of claim 1, further comprising a slew detector configured to monitor the input voltage and to detect the slew condition in response to a rapid change in the input voltage.

5. The system of claim 4, wherein the slew detector, in response to detecting the slew condition, is configured to deactivate the precision amplifier portion by activating a second current source associated with the slew amplifier portion to activate the slew amplifier portion.

6. The system of claim 5, wherein the first input stage comprises a first current source configured to generate a bias current associated with a plurality of bias transistors associated with the precision amplifier portion, and wherein the second current source is activated to generate an activation current associated with a plurality of bias transistors associated with the slew amplifier portion, wherein the activation current is greater than the bias current.

7. The system of claim 1, wherein the first input stage comprises a first input transistor and the first output stage comprises a first output transistor, wherein the first output transistor is coupled to a low-voltage rail via a first resistor, wherein the second input stage comprises a second input transistor and the second output stage comprises a second output transistor, wherein the second output transistor is coupled to the low-voltage rail via a second resistor and a voltage clamp arranged in parallel.

8. The system of claim 7, wherein the voltage clamp is configured as a Schottky diode to substantially mitigate saturation associated with the second input transistor during the slew condition.

9. The system of claim 1, wherein the input voltage is a differential input voltage, wherein the slew amplifier portion is activated in response to the detected slew condition to mitigate a thermal tail in the precision amplifier portion in response to the slew condition.

10. The system of claim 9, wherein the first input stage comprises a first input transistor configured to receive a first input voltage of the differential input voltage and a second input transistor configured to receive a second input voltage of the differential input voltage, wherein the second input stage comprises a third input transistor configured to receive the first input voltage and a fourth input transistor configured to receive the second input voltage, wherein, in response to the detected slew condition, the third transistor is activated to divert a tail current generated via a power voltage from being conducted through the first transistor to being conducted through the third transistor.

11. An integrated circuit (IC) chip comprising the amplifier system of claim 1.

12. A method for amplifying an input voltage via an amplifier system to generate an output voltage, the method comprising:
receiving the input voltage at a first input stage associated with a precision amplifier portion of the amplifier system to generate the output voltage at a first output stage associated with the precision amplifier portion;
receiving the input voltage at a second input stage associated with a slew amplifier portion of the amplifier system;
monitoring a slew-rate of the input voltage; and
activating a current source associated with the slew amplifier portion in response to detecting a slew condition associated with the input voltage to substantially deactivate the precision amplifier portion and to generate the output voltage at a second output stage associated with the slew amplifier portion.

13. The method of claim 12, wherein activating the current source comprises deactivating a bias transistor of the first input stage and activating a bias transistor of the second input stage to divert a tail current generated via a power voltage from flowing through the bias transistor of the first input stage to flow through the bias transistor of the second input stage to generate the output voltage at the second output stage based on the tail current.

14. The method of claim 13, wherein the input voltage is a differential input voltage, wherein deactivating the bias transistor comprises deactivating a bias transistor associated with a first pair of bias transistors of the first input stage, and wherein activating the bias transistor comprises activating a bias transistor associated with a second pair of bias transistors of the second input stage, such that the tail current is diverted from flowing through the bias transistor associated with the first pair of bias transistors to instead flow through the bias transistor associated with the second pair of bias transistors to substantially mitigate a thermal tail associated with a pair of input transistors associated with the first input stage.

15. The method of claim 13, wherein activating the current source comprises deactivating the bias transistor of the first input stage via a bias current to substantially deactivate the precision amplifier portion from generating the output voltage at the first output stage, and wherein activating the current source comprises deactivating the bias transistor of the first input stage via an activation current to substantially activate the slew amplifier portion to generate the output voltage at the second output stage, wherein the activation current is greater than the bias current.

16. The method of claim 11, further comprising clamping a voltage at a node associated with the second output stage in response to the detected slew condition via a voltage clamp that is arranged in parallel with a resistor interconnecting the node and a low-voltage rail, the node interconnecting an input transistor associated with the second input stage and an output transistor associated with the second output stage.

17. An amplifier system comprising:
a slew detector configured to monitor a differential input voltage and to detect a slew condition in response to a rapid change in the differential input voltage;
a precision amplifier portion comprising a first input stage configured to receive the differential input voltage and a first output stage configured to generate a differential output voltage at the first output stage based on the differential input voltage; and
a slew amplifier portion arranged in parallel with the precision amplifier portion and comprising a second input stage that receives the differential input voltage and a second output stage, the slew amplifier portion being activated to divert a tail current generated via a power voltage from flowing through a first bias transistor of a pair of bias transistors in the first input stage to flow through a second bias transistor of a pair of bias transistors in the second input stage in response to the detected slew condition to generate the output voltage based on the differential input voltage and based on the diverted tail current.

18. The system of claim 17, wherein the first input stage and the second input stage are coupled via a node that couples the first bias transistor of the pair of bias transistors associated with the first input stage and the second bias transistor associated with the second input stage, wherein the tail current is configured to flow from the power voltage through a resistor into the node, and wherein, during the slew condition, substantially all of the tail current is configured to flow from the node through the second bias transistor.

19. The system of claim 17, wherein the slew detector, in response to detecting the slew condition, is configured to deactivate the precision amplifier portion via activation of a current source associated with the slew amplifier portion to generate an activation current to activate the slew amplifier portion.

20. The system of claim 17, wherein the first input stage comprises a first pair of input transistors and the first output stage comprises a first pair of output transistors, wherein each of the first pair of output transistors is coupled to a low-voltage rail via a respective first resistor, wherein the second input stage comprises a second pair of input transistors and the second output stage comprises a second pair of output transistors, wherein each of the second pair of output transistors is coupled to the low-voltage rail via a respective second resistor and a respective voltage clamp arranged in parallel.

* * * * *